(12) United States Patent
Baranski et al.

(10) Patent No.: US 7,617,066 B2
(45) Date of Patent: Nov. 10, 2009

(54) VIRTUAL CRIMP VALIDATION SYSTEM

(75) Inventors: Mark D. Baranski, Warren, OH (US);
Bruce S. Gump, Warren, OH (US);
William J. Palm, Warren, OH (US)

(73) Assignee: Delphi Technologies, Inc., Troy, MI (US)

( * ) Notice: Subject to any disclaimer, the term of this patent is extended or adjusted under 35 U.S.C. 154(b) by 110 days.

(21) Appl. No.: 11/906,724

(22) Filed: Oct. 3, 2007

(65) Prior Publication Data

US 2009/0093988 A1 Apr. 9, 2009

(51) Int. Cl.
*G06F 19/00* (2006.01)
*G06F 17/00* (2006.01)
(52) U.S. Cl. ...................................... 702/117; 707/102
(58) Field of Classification Search .................. 702/108, 702/117; 703/1, 7; 439/397; 707/102, 103
See application file for complete search history.

(56) References Cited

U.S. PATENT DOCUMENTS

| 6,765,399 | B2 | 7/2004 | Shahriari et al. | |
| 7,010,474 | B1 | 3/2006 | Wang et al. | |
| 2003/0046973 | A1* | 3/2003 | Hamm et al. | 72/452.8 |
| 2005/0132312 | A1 | 6/2005 | Sasaki | |
| 2007/0218749 | A1* | 9/2007 | Viviroli | 439/397 |

OTHER PUBLICATIONS

SAE USCAR-21 Revision 1, Performance Specification for Cable-to-Terminal Electrical Crimps, Issued May 2002, Revised Apr. 2004, pp. 1-46.

* cited by examiner

*Primary Examiner*—Bryan Bui
(74) *Attorney, Agent, or Firm*—Thomas N. Twomey

(57) ABSTRACT

A system for validating a proposed crimp includes a pre-crimp modeler configured to establish a geometry for the proposed crimp, a plurality of virtual testing modules configured to determine at least one characteristic of the proposed crimp, and a virtual validation module configured to compare results from each of the plurality of virtual testing modules to predetermined criteria.

19 Claims, 2 Drawing Sheets

VIRTUAL CRIMP VALIDATION SYSTEM

BACKGROUND

At the foundation of many electrical technologies is the ability to electrically connect different electrical devices together. It is common to connect such electrical devices using some type of electrical cable assembly that includes an electrical conductor (such as a wire or coax cable) and a terminal connected to at least one end of the electrical conductor. The terminal is typically "crimped" to the end of the conductor using a crimping tool, which effectively reforms the terminal around the conductor to form a firm connection. In use, the terminal is used to connect the conductor to the electrical device. Often, the reliability of the electrical device depends in part on the quality of the connection created between the terminal and the conductor (i.e., the "crimp"). For this reason, especially in high volume manufacturing environments, the conductor-to-terminal interface is evaluated using a crimp validation process to determine whether the crimp meets or exceeds certain electrical and mechanical performance levels.

One known crimp validation process used by the automotive industry is the USCAR-21 specification, developed by the Society of Automotive Engineers (SAE) and the United States Center for Automotive Research (USCAR). This specification lists a series of tests to be performed to validate a cable/terminal combination prior to use in a production vehicle. These tests involve crimp design development, sample build, sample inspection, physical testing, results analysis and production documentation so that the crimp can ultimately be classified as "validated." Unfortunately, this type of validation process requires producing, and subsequently destroying, many examples of a proposed crimp and requires several weeks to complete.

Accordingly, the embodiments described hereinafter were developed in light of these and other drawbacks associated with known crimp validation systems.

BRIEF SUMMARY

A system for validating a proposed crimp includes a pre-crimp modeler configured to establish a geometry for the proposed crimp, a plurality of virtual testing modules configured to determine at least one characteristic of the proposed crimp, and a virtual validation module configured to compare results from each of the plurality of virtual testing modules to predetermined criteria.

A method for validating a proposed crimp includes generating a crimp geometry based on proposed crimp parameters, generating a virtual model of the proposed crimp, determining characteristics of the proposed crimp using the virtual model and comparing the characteristics of the proposed crimp to predetermined criteria.

BRIEF DESCRIPTION OF THE DRAWINGS

The foregoing, as well as additional objects, features and advantages of the present disclosure will be better understood from the following detailed description.

DETAILED DESCRIPTION

A system and method for providing virtual crimp validation is provided. The system includes a pre-crimp modeler, a plurality of virtual testing modules, a virtual validation module and a database. The pre-crimp modeler is used in conjunction with a terminal crimp validation request to establish the basic dimensions of the terminal and cable being used for a particular crimp application. A two or three-dimensional virtual model of an actual crimp using the output of the pre-crimp modeler is then created and used by the various testing modules to determine the physical, mechanical and electrical capabilities of the proposed crimp. The virtual crimp validation system ties together the results from each of the testing modules and updates the database with the crimp validation records from each of the testing modules.

Figure 1:
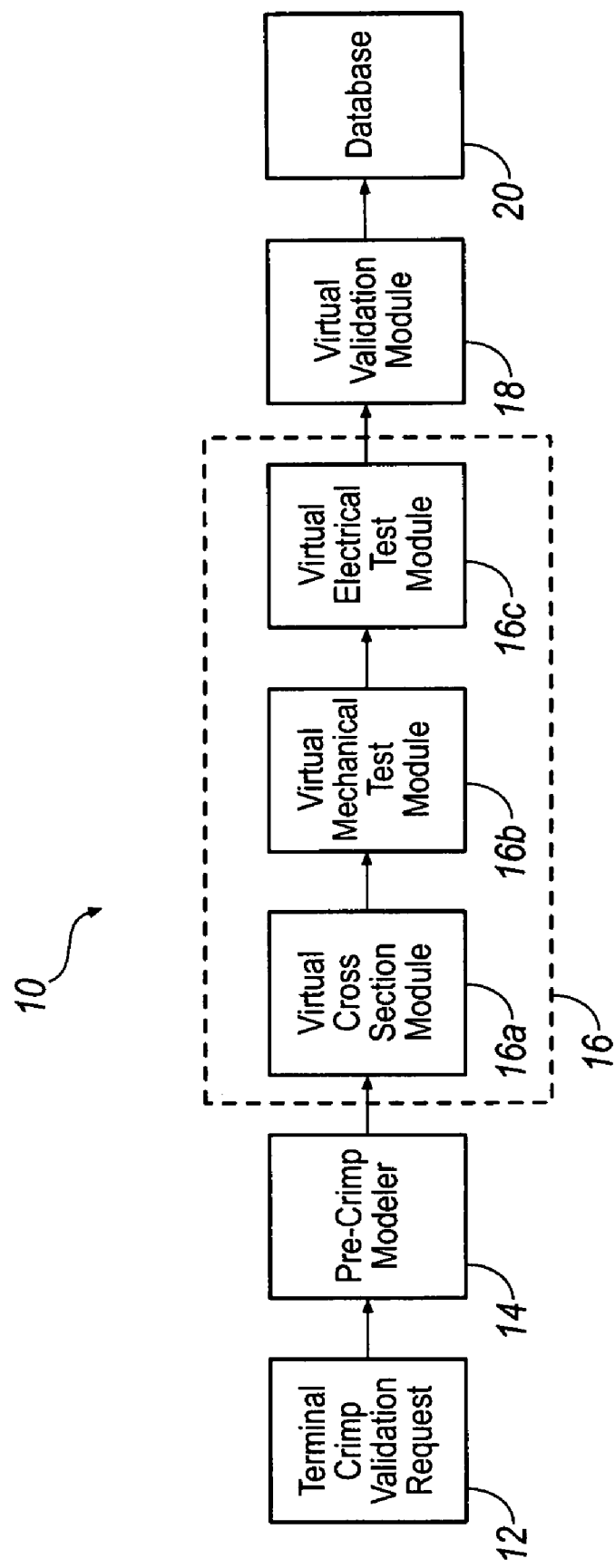
FIG. 1 is an exemplary virtual crimp validation system, according to an embodiment.

FIG. 1 illustrates an exemplary virtual crimp validation system 10 wherein a terminal crimp validation request 12 is made to a pre-crimp modeler 14. In one embodiment, the crimp validation request is an on-line request that includes all of the information necessary to generate the basic dimensions for a particular terminal and cable to be crimped. In another embodiment, the information is manually input into the system. The information provided to the pre-crimp modeler 14 includes, but is not limited to, the dimensions of the terminal including the thickness of the terminal material, the height and width of the terminal wings (i.e., generally the portion of the terminal that is folded around the cable and partially pressed into the underlying conductor to make an electrical connection), crimp area lengths and features, and wire specifications such as gauge, size, number of strands, diameter and/or cross sectional area of strands and insulation type. It should be appreciated that other characteristics of the wire and the terminal may also be accommodated. Such characteristics may include, for example, the material composition, mechanical and/or electrical properties of the conductor, the insulation, and/or the terminal to be coupled, or other properties that may have an impact on the physical, mechanical and/or electrical characteristics of the crimp.

In some embodiments, the pre-crimp modeler 14 may also have access to a crimp tool geometry database and can determine the tool geometry needed to form the crimp area of the terminal to the cable using optimization of compaction algorithms. Compaction algorithms generally determine the total cross section of all the cable strands and terminal crimp wings before being crimped and then again at various crimp heights as the strands and terminal crimp wings are compressed. At each crimp height, the new cross section is calculated and compared to the uncompressed original cross section. The percentage of compression can then be calculated. The output of the pre-crimp modeler 14 establishes the geometry for a particular crimp and is used by a plurality of testing modules 16 to determine the physical, mechanical and electrical characteristics of the crimp. In one embodiment, each of the testing modules 16 employ Finite Element Analysis (FEA), however, one of ordinary skill in the art understands that any suitable modeling tool may be used.

The plurality of testing modules 16 includes a virtual cross section module 16a, a virtual mechanical test module 16b and a virtual electrical test module 16c. The virtual cross section module 16a creates a two or three-dimensional graphic model of the actual crimp based on the geometry provided by the pre-crimp modeler 14. The virtual cross section module 16a further generates a cross section of the proposed crimp that shows, among other things, the overall crimp geometry and the wing penetration into the cable conductor. Core compaction (i.e., the compression of the conductors after crimping) is also modeled such that any voids between the strands and/or wing walls can be detected along with good visualization of burr size (squeezed metal from the terminal due to compression that leaves a protruding point on the bottom side of the terminal). This virtual cross section can then be compared to attributes of "good" cross sections, such as wing placement, height-width ratio and strand distribution. If the cross section generated in the virtual cross section module 16a "passes" these attribute comparisons, it can be transferred to the next testing module, which in this embodiment is the virtual mechanical test module 16b.

The virtual mechanical test module 16b uses math-based computer modeling based on historical data of previously completed crimp strengths to predict the axial pull force strength of the wire if it was to be pulled from the terminal. In some embodiments, where no historical data is available, the calculations may be based on interpolation or prior knowledge of database content rather than actual data. This model also takes into consideration plating materials, cable construction, core compaction and terminal characteristics such as serrations, notches and knurls, and any other properties that may have an impact on the physical, mechanical and/or electrical characteristics of the crimp. Serrations generally refer to stamped grooves located in the crimp area of the terminal that are perpendicular to the direction of the cable so that when the terminal wings are crimped, the serrations cut into the wire's surface (through any oxide or corrosion films that may have formed) allowing a good terminal-to-wire electrical interface. Knurls refer to small pyramidal patterns that are stamped into the terminal crimp area, while notches are openings on the top of a crimped terminal wing. Both features allow the wings to cut into the wire to make a good electrical contact.

Like the virtual mechanical test module 16b, the virtual electrical test module 16c uses a math-based computer model based on historical data to predict the electrical performance of the proposed crimps. Where no historical data is available, the testing may be based on interpolation or prior knowledge of database content rather than actual data. In one embodiment, the virtual tests simulate the "Current Cycle Test" and the "Accelerated Environmental Test" from the USCAR-21 specification and are used to predict electrical performance. One of ordinary skill in the art understands, however, that other tests for simulating electrical performance may be applied.

Once the proposed crimp has completed the plurality of virtual testing modules 16, the proposed crimp is evaluated by the virtual validation module 18, which ties together all of the previous modeling and testing to complete that "validation" process. In this module, the database 20 is automatically updated with all of the crimp validation records that were gathered in the various testing modules. In one embodiment, this module may also be configured to notify the requester that the proposed crimp validation request was completed and loaded into the validation database.

Figure 2:
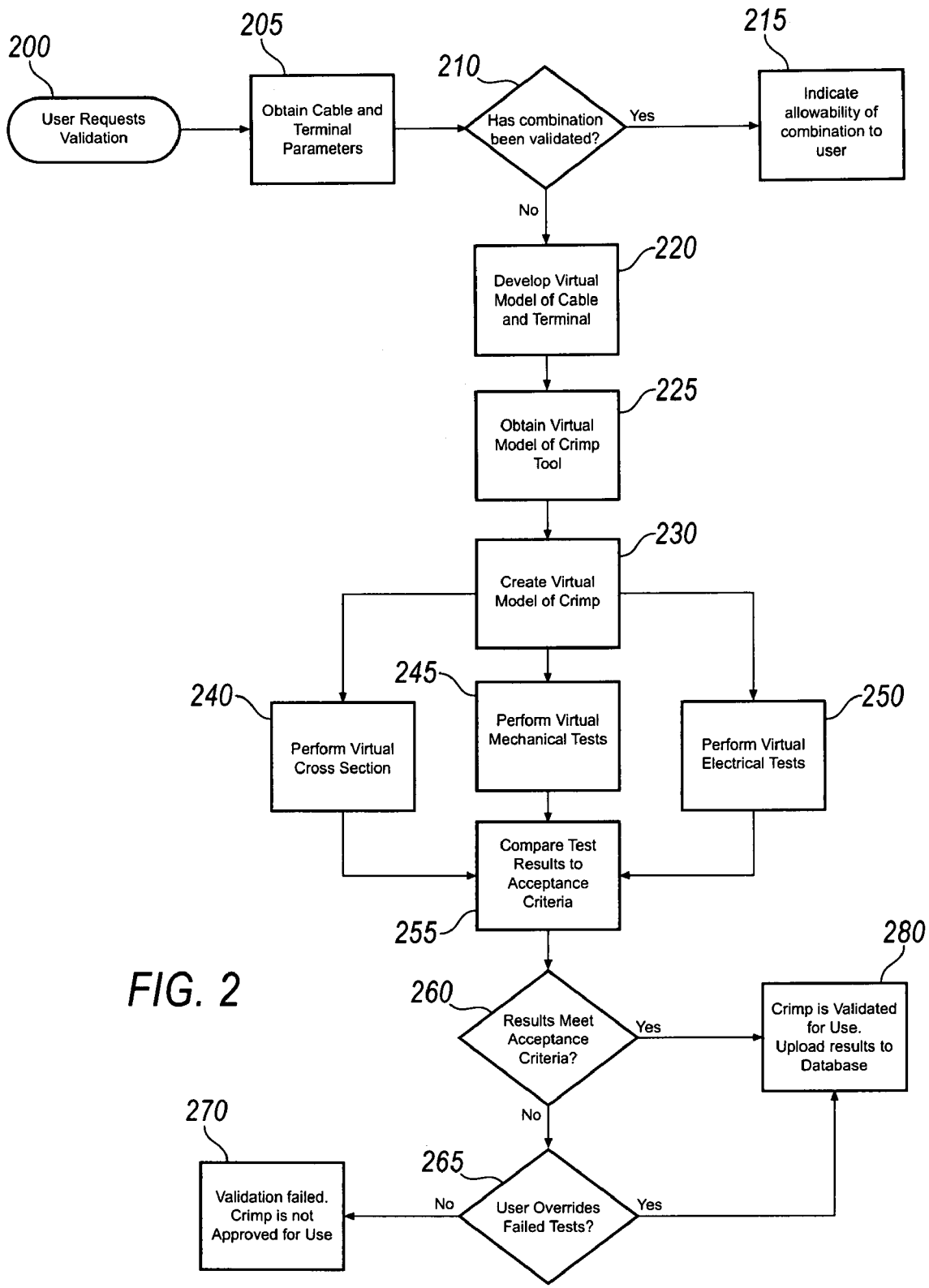
FIG. 2 is a flow diagram illustrating an exemplary crimp validation process according to an embodiment.

FIG. 2 is a flow diagram illustrating an exemplary crimp validation process according to an embodiment. The process begins at step 200 when the user requests a crimp validation. When the validation process has been begun, the parameters for the desired cable and terminal are determined at step 205. Terminal parameters may include, but are not limited to, the materials used, the length of the terminal, the thickness of the material, the number and length of the terminal wings, and any other appropriate parameter. The cable parameters can include parameters such as cable length, core material and gauge, coatings, insulator material and thickness, the number of internal conductive strands, and any other appropriate parameter. The parameters for the cable and terminal can be obtained through manual user input, by a user choosing elements from a list saved on a system, from file information provided by a manufacturer, or through any other applicable method.

When the parameters have been determined, the proposed terminal/cable combination may be checked against a verification database to determine whether the combination has previously been validated, as shown at step 210. The validation database is stored in a manner that is accessible to appropriate personnel. If the crimp has been previously validated, the system at step 215 provides an indication to the user that the proposed combination is validated. The system may provide additional information to a user, such as the date when the crimp was validated, the user who performed the validation and the individual test results.

If the proposed crimp has not been validated, a virtual model of the cable and terminal are developed at step 220. At step 225, crimp tool parameters may be gathered that include press speed and force, die geometry, tool friction, and other pertinent parameters that may affect crimp formation. At step 230, the determined parameters are used to create a virtual model of the crimp. The virtual model of the crimp may be made using a computer aided design (CAD) tool or a finite element analysis (FEA) tool. Additionally, a virtual model may be provided by a vendor for use in subsequent analyses. A FEA tool uses the finite element method to develop a two-dimensional or three-dimensional model of the proposed crimp. A virtual model of the crimp tool may also be obtained, or may be created using an appropriate tool.

The virtual models of the crimp and tool may then be used in step 230 in a FEA analysis to model the crimping process. The process may be modeled from the point when the wire and terminal are placed in the tool to the point when the crimp is created and the upper die portion retracts. A thorough FEA analysis may monitor all aspects of the crimp process, including the deformation of the cable and the terminal, displacement of cable insulation and penetration of terminal grips into the cable conductor.

From the FEA model developed in step 230, a virtual cross section of the crimp can be developed at step 240 and used to identify various physical characteristics of the proposed crimp including, but not limited to, the appearance of the ends of conductors and insulation, the cutoff of the wire, the bellmouth on either end of the crimp, the appearance of the conductor crimp and insulator crimp, the individual cable seal, and the bend and twist in the terminal. In addition, crimp geometry may also be verified. Among the geometry parameters measured are conductor crimp height and width, insulation crimp height and width, as well as geometry and integrity of the cross section.

At step 245, mechanical tests of the crimp model may also be performed using the FEA tool. Depending on the specific application, certain aspects of the virtual crimp model may be altered. For instance, when testing the conductor crimp pull out force, it may be useful to use a virtual crimp model wherein the crimp is open along the insulator. This could help ensure the only force being measured is that imparted by those terminal grips which are in conductive contact with the cable. Additional mechanical tests can be substituted or included as required for a given application.

Additionally, at step 250, the FEA tool can be used to test electrical properties of the virtual model of the crimp. The virtual test parameters may be adjusted depending on the application for which the crimp is to be used. These parameters can include the amount and duration of voltage and/or current applied to a crimp, ambient temperature and pressure, ambient humidity, and other pertinent parameters. Among the virtual tests which may be performed are accelerated aging tests that measure expansion and contraction of the crimps in response to thermal changes, and accelerated environmental testing that determines the susceptibility of a crimp to environmental factors.

When the virtual tests have been performed, the results may be compared to predetermined acceptance criteria at step 255. Acceptance criteria may include values that have previously been determined "acceptable" values for those parameters measured during the course of testing. If, at step 260, it is determined that the results from the test are within parameters deemed acceptable according to test criteria, the crimp may be approved for use at step 280. At this step, the results of the test may also be uploaded to the database, accessible by appropriate personnel, to indicate allowability of a given combination.

If it is determined at step 260 that the test results do not pass one or more of the criteria, the user may be so notified. Based on the nature of the failed test, the experience of the user, and the use to which the proposed design will be put, the user may choose to override the test results at step 265 and indicate acceptability of the failed parameter. For instance, if the user knows, from past experience, that a given value is appropriate for a proposed application, despite the value falling outside the acceptance criteria, the user may choose to certify the crimp. In such a case, the test results may be loaded to the validation database at step 280. The database may then indicate that the crimp is validated for use. In addition, the database may indicate that the validation was the result of a user override. The database may include information such as the original test values, the identity of the user who authorized the validation, the reasons for the validation, and intended applications for which the overridden tests are certified.

If the proposed crimp does not pass one or more of the test criteria, and the user does not override the failed test, the user is informed that the crimp is not valid for use at step 270. The user may then choose to test another combination of terminal and cable. The results of the failed test may be made available to the user, and may be uploaded to a validation database with an indication that the application failed.

The present invention may be described herein in terms of functional block components, optional selections and various processing steps. It should be appreciated that such functional blocks may be realized by any number of hardware and/or software components configured to perform the specified functions and may be implemented by computer program instructions.

As will be appreciated by one of ordinary skill in the art, the present invention may be embodied as a method, a data processing system, a device for data processing, an integrated circuit, and/or a computer program product. Accordingly, the present invention may take the form of an entirely software embodiment, an entirely hardware embodiment, or an embodiment combining aspects of both software and hardware. Furthermore, the present invention may take the form of a computer program product on a computer-readable storage medium having computer-readable program code means embodied in the storage medium. Any suitable computer-readable storage medium may be utilized, including hard disks, CD-ROM, optical storage devices, magnetic storage devices, and/or the like.

Accordingly, functional blocks of the block diagrams and flowchart illustrations support combinations of means for performing the specified functions, combinations of steps for performing the specified functions, and program instruction means for performing the specified functions. It will be understood that each functional block of the block diagrams and flowchart illustrations, and combinations of functional blocks in the block diagrams and flowchart illustrations, can be implemented by either special purpose hardware-based computer systems, which perform the specified functions or steps, or suitable combinations of special purpose hardware and computer instructions.

Such computer program instructions may, for example, be stored in a computer-readable memory that can direct a computer or other programmable data processing apparatus to function in a particular manner, such that the instructions stored in the computer-readable memory produce an article of manufacture including instruction means that implement the function specified in the flowchart block or blocks.

Alternatively, the computer program instructions may also be loaded onto a computer or other programmable data processing apparatus to cause a series of operational steps to be performed on the computer or other programmable apparatus to produce a computer-implemented process, such that the instructions that execute on the computer or other programmable apparatus provide steps for implementing the functions specified in the flowchart block or blocks.

Still further, the computer program instructions may be loaded onto a general purpose computer, special purpose computer, or other programmable data processing apparatus to produce a machine, such that the instructions that execute on the computer or other programmable data processing apparatus create means for implementing the functions specified in the flowchart block or blocks.

In an exemplary embodiment, a system in accordance with the invention includes a host server or other computing systems including a processor for processing digital data, a memory coupled to said processor for storing digital data, an input digitizer coupled to the processor for inputting digital data, an application program stored in said memory and accessible by said processor for directing processing of digital data by said processor, a display coupled to the processor and memory for displaying information derived from digital data processed by said processor and a plurality of databases, said databases including data regarding characteristics of the wire and the terminal and/or like data that could be used in association with the present invention.

As those skilled in the art will appreciate, a computer implementation of the invention may include an operating system, such as Windows NT, 95/98/2000/XP/Vista, Linux, MacOS, OS/2, BeOS, UNIX or Solaris, as well as various conventional support software and drivers typically associated with computers. The invention could also be used in conjunction with any type of personal computer, network computer, workstation, minicomputer, mainframe, or the like. Moreover, although the invention may be implemented with communications protocols such as TCP/IP, IPX, Appletalk, IP-6, NetBIOS, OSI or any number of existing or future protocols. In addition, computing units within an exemplary system may be connected with each other via a data communication network and may be suitably coupled to network via data links, for which a variety of conventional communications media and protocols may be used.

A database of an exemplary system in accordance with the invention may be any type of database, such as relational, hierarchical, object-oriented, and/or the like. Common database products that may be used to implement the databases include DB2 by IBM™ (White Plains, N.Y.), any of the database products available from ORACLE CORPORA- TION™ (Redwood Shores, Calif.), MICROSOFT ACCESS™ by MICROSOFT CORPORATION™ (Redmond, Wash.), or any other database product. Database may be organized in any suitable manner, including as data tables or lookup tables. Association of certain data may be accomplished through any data association technique known and practiced in the art. For example, the association may be accomplished either manually or automatically. Automatic association techniques may include, for example, a database search, a database merge, GREP, AGREP, SQL, and/or the like.

The present invention may employ various integrated circuit components, e.g., memory elements, processing elements, logic elements, look-up tables, and the like, which may carry out a variety of functions under the control of one or more microprocessors or other control devices. Similarly, the software elements of the present invention may be implemented with any programming or scripting language such as C, C++, Java, COBOL, assembler, PERL, extensible markup language (XML), with the various algorithms being implemented with any combination of data structures, objects, processes, routines or other programming elements. Further, it should be noted that the present invention may employ any number of conventional techniques for data transmission, signaling, data processing, network control, and the like.

It should be appreciated that the particular implementations shown and described herein are illustrative of the invention and its best mode and are not intended to otherwise limit the scope of the present invention in any way. Indeed, for the sake of brevity, conventional data networking, application development and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical system.

It is to be understood that the above description is intended to be illustrative and not restrictive. Many alternative approaches or applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future examples. In sum, it should be understood that the invention is capable of modification and variation and is limited only by the following claims.

The present embodiments have been particularly shown and described, which are merely illustrative of the best modes. It should be understood by those skilled in the art that various alternatives to the embodiments described herein may be employed in practicing the claims without departing from the spirit and scope as defined in the following claims. It is intended that the following claims define the scope of the invention and that the method and apparatus within the scope of these claims and their equivalents be covered thereby. This description should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What is claimed is:

1. A computer system for validating a proposed crimp, comprising:
    a pre-crimp modeler configured to establish a geometry for the proposed crimp;
    a plurality of virtual testing modules configured to determine at least one characteristic of the proposed crimp by using a math based computer modeling based on historical data from a database storing crimp data or interpolation or prior knowledge of database content; and
    a virtual validation module configured to compare results from each of said plurality of virtual testing modules to respective predetermined acceptable criteria in said database and determine if the at least one characteristic is within parameters deemed acceptable according to test criteria in said database.

2. The system of claim 1, wherein said plurality of virtual testing modules employ finite element analysis to develop a virtual model of the proposed crimp.

3. The system of claim 1, wherein said plurality of virtual testing modules includes a virtual cross section module configured to generate a virtual cross section of the proposed crimp.

4. The system of claim 3, wherein said virtual cross section of the proposed crimp is a two-dimensional model based on said geometry from said pre-crimp modeler.

5. The system of claim 3, wherein said virtual cross section of the proposed crimp is a three-dimensional model based on said geometry from said pre-crimp modeler.

6. The system of claim 1, wherein said plurality of virtual testing modules includes a virtual mechanical test module.

7. The system of claim 1, wherein said plurality of virtual testing modules includes a virtual electrical test module.

8. The system of claim 1, wherein said pre-crimp modeler is configured to determine a tool geometry for forming the proposed crimp.

9. The system of claim 8, wherein said tool geometry is determined using compaction algorithms.

10. The system of claim 1 wherein test results within acceptable parameters according to test criteria are uploaded to said database to indicate allowability of a given combination of a proposed crimp.

11. A computer method for a computer with a database, a programmable data processing apparatus having at least one test module, an input device and a display for validating a proposed crimp, comprising the steps of:
    uploading proposed crimp parameters to said computer;
    said computer generating a crimp geometry based on said proposed crimp parameters;
    said computer generating a virtual model of the proposed crimp;
    said computer determining characteristics of the proposed crimp using said virtual model in said test module using a math based computer modeling based on historical data from said database or interpolation or prior knowledge of database content; and
    said computer comparing said characteristics of the proposed crimp to respective predetermined acceptable criteria in said database and determine if the results are within parameters acceptable according to test criteria in said database and providing an indication of acceptance or non-acceptance of said characteristic of said proposed crimp.

12. The method of claim 11, wherein generating said virtual model of the proposed crimp includes generating a virtual cross section of the proposed crimp.

13. The method of claim 11, further including validating the proposed crimp if said characteristics meet or exceed said predetermined criteria.

14. The method of claim 11, wherein determining characteristics of the proposed crimp include modeling the proposed crimp using finite element analysis.

15. The method of claim 11, further including determining whether the proposed crimp has been previously validated using a verification database.

16. The method of claim 11, wherein determining characteristics of the proposed crimp includes determining physical, mechanical and electrical characteristics.

17. The method of claim 11, wherein determining characteristics of the proposed crimp includes predicting an axial pull strength of a wire if it was pulled from a terminal.

18. The method of claim 11, wherein determining characteristics of the proposed crimp includes predicting electrical performance of the proposed crimp.

19. A computer method for a computer with a database, a programmable data processing apparatus having at least one test module, an input device and a display for validating a proposed crimp, comprising the steps of:

uploading proposed crimp parameters to said computer;

said computer generating a crimp geometry based on said proposed crimp parameters;

said computer generating a virtual model of the proposed crimp;

said computer determining characteristics of the proposed crimp using said virtual model in said test module using a math based computer modeling based on historical data from said database or interpolation or prior knowledge of database content;

said computer comparing said characteristics of the proposed crimp to respective predetermined acceptable criteria in said database and determine if the results are within parameters acceptable according to test criteria in said database and providing an indication of acceptance or non-acceptance of said characteristic of said proposed crimp; and determining a tool geometry based on optimization of compact ion algorithms.

* * * * *